United States Patent
Chen et al.

(10) Patent No.: US 6,453,443 B1
(45) Date of Patent: Sep. 17, 2002

(54) METHOD FOR CELL MODELING AND TIMING VERIFICATION OF CHIP DESIGNS WITH VOLTAGE DROP

(75) Inventors: Pi-Cheng Chen, Hsin-Chu (TW); Wen-Hao Chen, Chiao-Tou (TW); Ming-Chyuan Chen, Hsinchu (TW); Hsien-Te Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/835,028

(22) Filed: Apr. 16, 2001

(51) Int. Cl.$^7$ .............................................. G06F 17/50
(52) U.S. Cl. ..................... 716/1; 716/5; 716/6
(58) Field of Search ............................. 716/1, 5, 6, 10, 716/12

(56) References Cited

U.S. PATENT DOCUMENTS

| | | | |
|---|---|---|---|
| 5,446,676 A | | 8/1995 | Huang et al. ............ 703/19 |
| 5,471,409 A | | 11/1995 | Tani ...................... 716/1 |
| 5,535,223 A | * | 7/1996 | Horstmann et al. ........ 716/6 |
| 5,598,348 A | | 1/1997 | Rusu et al. ............... 716/2 |
| 5,648,909 A | * | 7/1997 | Biro et al. ............... 716/6 |
| 5,657,239 A | * | 8/1997 | Grodstein et al. ......... 716/6 |
| 5,872,952 A | | 2/1999 | Tuan et al. .............. 703/14 |
| 5,878,053 A | | 3/1999 | Koh et al. ............. 714/724 |
| 5,930,148 A | | 7/1999 | Bjorksten et al. .......... 716/6 |
| 5,949,689 A | | 9/1999 | Olson et al. ............. 716/17 |
| 6,088,523 A | | 7/2000 | Nabors et al. ............. 703/4 |
| 6,219,822 B1 | * | 4/2001 | Gristede et al. .......... 716/10 |
| 6,253,361 B1 | * | 6/2001 | Buch ..................... 716/6 |
| 6,269,467 B1 | * | 7/2001 | Chang et al. ............. 716/1 |
| 6,301,693 B1 | * | 10/2001 | Naylor et al. ........... 716/10 |

OTHER PUBLICATIONS

"Interconnection Analysis for Standard Cell Layouts", Pedram et al., IEEE Trans. on Computer Aided Design of Integrated Circuits and Systems, vol. 18, No. 10, Oct. 1999, IEEE, pp. 1512–1519.

"Clock Skew Verification in the Presence of IR Drop in the Power Distribution Network", Saleh et al., IEEE Trans. on Computer Aided Design of Integrated Circuits and Systems, vol. 19, No. 6, Jun. 2000, IEEE, pp. 635–644.

* cited by examiner

Primary Examiner—Trong Phan
(74) Attorney, Agent, or Firm—George O. Saile; Stephen B. Ackerman

(57) ABSTRACT

In the present invention a method is described to produce a whole chip timing verification that includes the effects of voltage variation on delay. This is done by creating a netlist, defining cell input and output (I/O) delay paths, and calculating the difference timing caused by differences in power supply voltage. The incremental I/O path delay is calculated by adding delay changes caused by all power pins. Whole chip timings are generated without consideration to voltage drops and then modified using the incremental path delay. The modified whole chip timing data file is used with traditional timing verification tools to perform a whole chip cell level timing verification.

10 Claims, 2 Drawing Sheets

METHOD FOR CELL MODELING AND TIMING VERIFICATION OF CHIP DESIGNS WITH VOLTAGE DROP

BACKGROUND OF THE INVENTION

1. Field of Invention

The present invention relates to integrated circuit design and in particular the modeling and timing verification of chip designs.

2. Description of Related Art

In high density integrated circuit design voltage drop caused by missing vias or an inadequate power network design can cause timing problems. In current design technology, voltage drop violations are flagged with respect to a predefined limit. No timing delay data is included in cell level timing verification, and chip design simulations with voltage drops are not based on cell timing models. In addition the simulation time is quite lengthy.

In U.S. Pat. No. 6,088,523 (Nabors et al.) a method and apparatus is directed for simulating an electrical circuit design using approximate circuit element tapers. In U.S. Pat. No. 5,949,689 (Olson et al.) is directed to a method and system for modeling power consumed by a logic cell in a computer controlled power estimation process. In U.S. Pat. No. 5,930,148 (Bjorksten et aL) a method and system for verifying is directed a digital circuit design including dynamic circuit cells that utilize diverse circuit techniques. In U.S. Pat. No. 5,878,053 (Koh et al.) hierarchical power network simulation and analysis tool is directed toward reliability testing of deep sub micron IC designs. However, the simulation and analysis does not include timing delay data. In U.S. Pat. No. 5,872,952 (Taun et al.) a method is directed toward power net analysis of integrated circuits. A power net simulator uses current values to calculate characteristics of the power network. In U.S. Pat. No. 5,598,348 a method and apparatus is directed to analyzing the power network of a VLSI circuit, but does not calculate cell timing delay data. In U.S. Pat. No. 5,471,409 (Tani) a logic and circuit simulation apparatus is directed to simulation based on signal propagation delay time and high reliability. However, the simulation does not use a voltage drop cell timing model. In U.S. Pat. No. 5,446,676 (Huang et al.) a method is directed to transistor level timing, power simulator and power analyzer.

In "Interconnection Analysis for Standard Cell Layouts" Pedram et al., IEEE Transactions on Computer Aided Design of Integrated Circuits and Systems, Vol. 18, No. Oct. 10, 1999, IEEE, pp1512–1519, a model and procedure is directed to predicting common physical design characteristics of standard cell layout, such as connection length and chip area. The predicted results are obtained from analysis of a net list and no finctionality of the design is used. In "Clock Skew Verification in the Presence of IR Drop in the Power Distribution Network", Saleh et al., IEEE Transactions on Computer Aided Design of Integrated Circuits and Systems, Vol. 19, No. Jun. 6, 2000, IEEE, pp635–644, methodology is presented directed to verification of clock delay and skew. An iterative technique is presented for clock simulation in the presence of full chip dynamic IR drop.

Current methods of verifying voltage drop generally identify voltage drop violations with respect to a predefined limit. No timing delay data is used for cell level timing verification. Chip design simulations, which include voltage drops, are not based on cell level timing model, and the simulation time is very long. Previous solutions set a global voltage drop limit which does not have a tight relationship with chip failures including timing failures. Whole chip circuit simulation requires a lot of simulation time and is affordable with few test vectors. A method is needed for cell level modeling and timing verification of chip designs with voltage drops being considered that can be accomplished in a reasonable amount of time.

SUMMARY OF THE INVENTION

It is an objective of the present invention to characterize cell timing variation rate with respect to voltage drops.

It is also an objective of the present invention to calculate incremental cell I/O (input/output) path delay in the presence of voltage drops.

It is further an objective of the present invention to perform whole chip, cell level timing verification.

It is still further an objective of the present invention to enable a fast, whole chip, cell level timing verification in the presence of voltage drops.

The present invention characterizes cell timing variation rate with respect to voltage drop for each cell in the design library. The incremental I/O path delay in the presence of voltage drops is calculated by adding delay changes to a nominal cell delay value. This is done for each power pin using voltage change values and timing variation rate caused by the power pin. Then a whole chip cell level timing data file is produced without considering voltage drops and is modified with a whole chip timing data file which includes voltage drops. The modified whole chip timing data file is used with traditional timing verification tools to perform a whole chip cell level timing verification which includes the effects of voltage drops.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
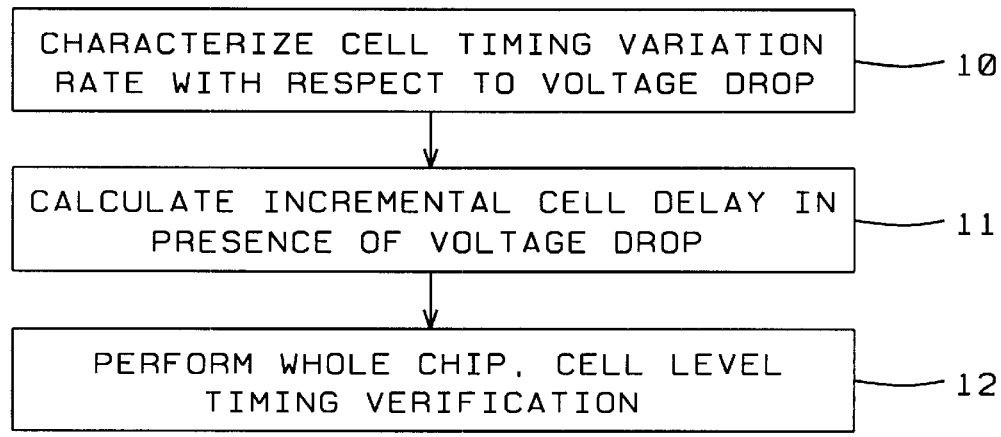
FIG. 1 is an overview of the method for generating whole chip cell level timing verification which includes voltage drop effects of the present invention.

In FIG. 1 is an overview of the method of the preferred embodiment of the present invention. The first general step in the method is to characterize a cell timing variation rate with respect to voltage drop 10. In doing this a netlist is prepared using Spice format or comparable circuit design tools. Cell I/O (input/output) delay paths are defined and simulation data is created to characterize timing variations with respect to supply voltage change. A simulation is performed and a (delta delay)/(defta voltage change) is created as the timing variation rate. The next step is to calculate incremental cell delay in the presence of a voltage drop 11. A power network analysis tool is used to calculate voltage change values at each power supply pin, and using the voltage change value and the timing variation rate, a delay change is calculated for each power pin. this allows the incremental I/O path delay to be calculated. The third step in the process entails performing a whole chip cell level timing verification 12. A delay calculation tool is used to generate a timing data file without considering voltage drop effects and then the timing data file is modified with the timing effects of differences in voltage drop. This results in being able to use the modified timing data file to perform a whole chip cell level timing verification.

Figure 2:
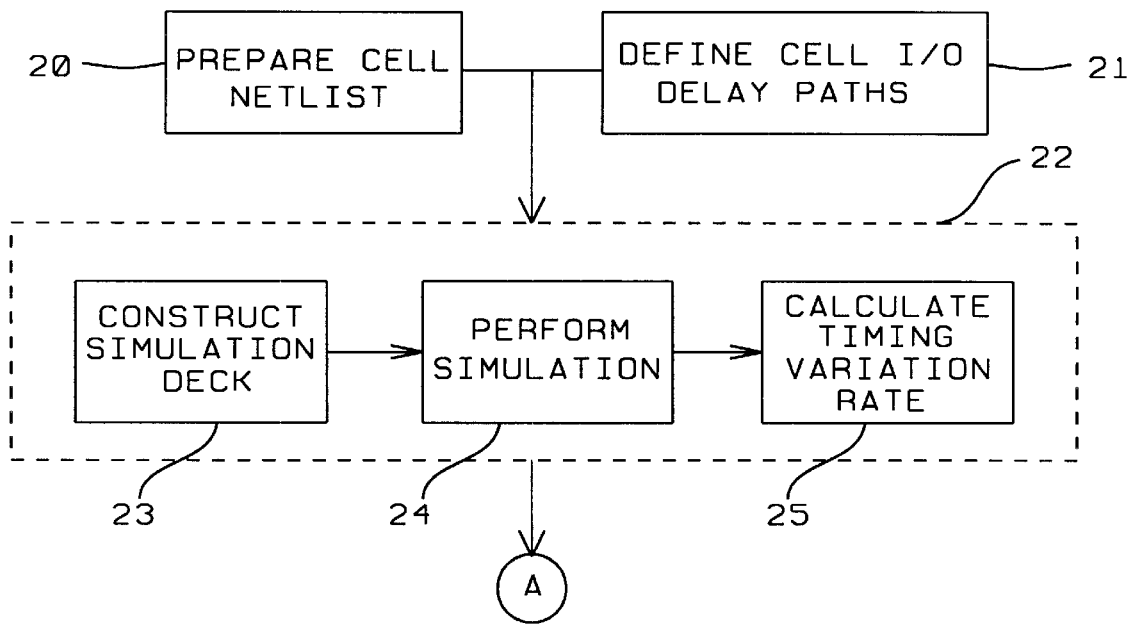
FIG. 2 is the method for characterizing timing variation rates of the present invention.

In FIG. 2 is shown the details of the method to characterize cell timing variation rate with respect to voltage drop 10. A cell netlist is prepared 20 using Spice format or similar circuit extraction tool, and cell I/O delay paths are defined 21. Both the netlist 20 and the defined cell I/O delay paths 21 are used as inputs to be used for simulation and analysis for each I/O delay path and each power supply pin 22. Then for each I/O delay path and each power supply pin, simulation data (could be a Spice simulation deck) is developed for characterizing timing variation with respect to supply voltage change 23. Simulation (could be Spice simulation) is next performed 24, and the timing voltage rate is calculated 25 where a (delta delay)/(delta voltage) is created for each I/O delay path for each power supply pin. The results of the analysis for each I/O delay path and each power supply pin are fed to the next step shown in FIG. 3 and indicated by "A".

Figure 3:
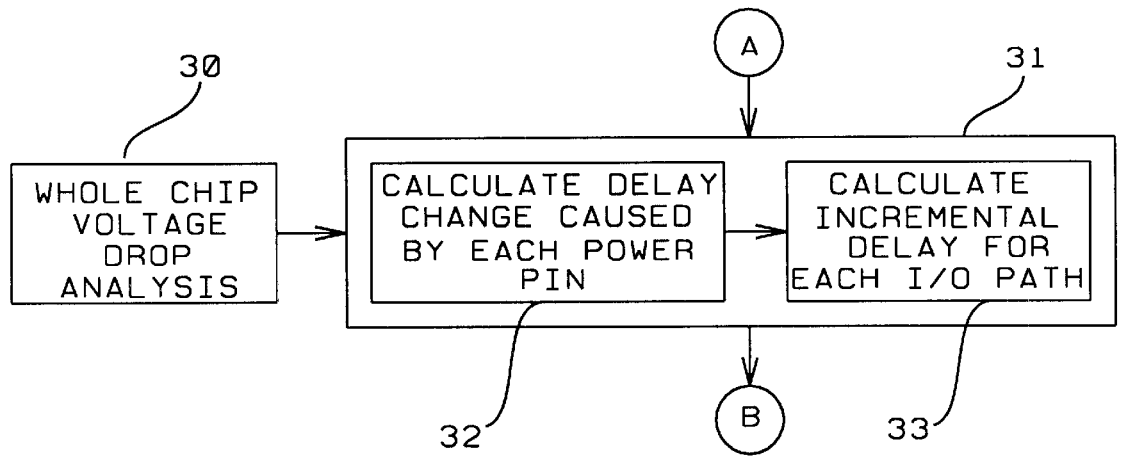
FIG. 3 is the method for calculating incremental cell I/O path delay of the present invention.

In FIG. 3 the incremental cell I/O path delay is calculated. Using the results from FIG. 2 as indicated by "A" and a power network analysis tool, the voltage change values for each power supply is calculated 30. Then for all pins and for every I/O delay path the incremental I/O path delay is calculated 31. For each I/O delay path and each power supply pin the delay change caused by each power pin is calculated 32. Then for each I/O delay path the incremental delay for each I/O delay path is calculated 33. The results of the incremental I/O path delay calculation 31 are fed to final step in the process shown in FIG. 4 and indicated by "B".

Figure 4:
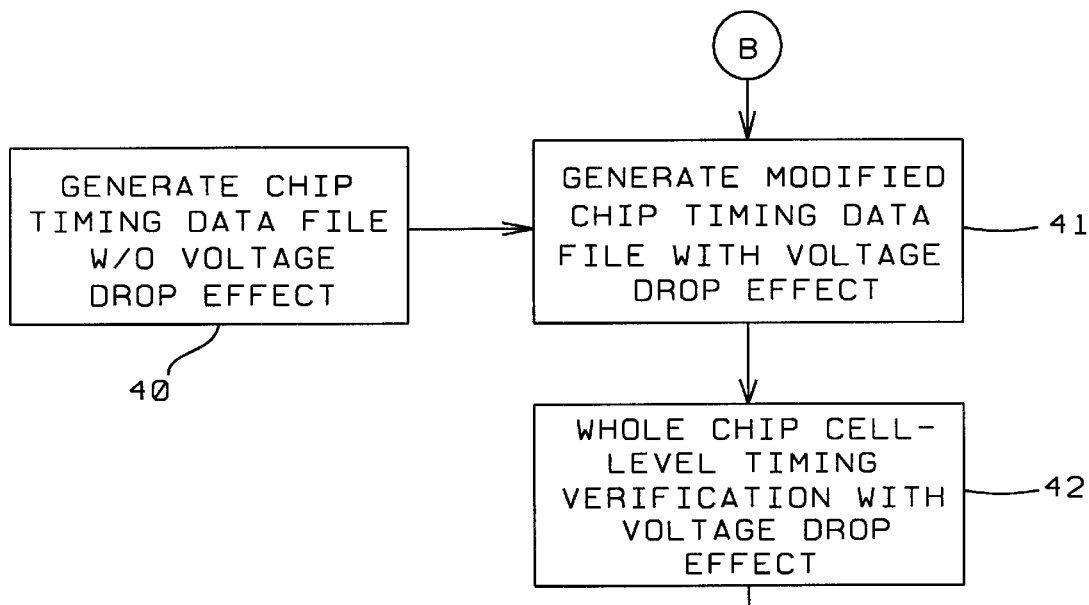
FIG. 4 is the method for performing whole chip cell level timing verification of the present invention.

In FIG. 4 the results from the incremental I/O path delay calculation 31 and a chip timing data file 40 are connected to a step to modify chip timing data with the effects of variations in voltage drop 40. A delay calculation tool is used to generate a whole chip timing data file without considering the effects of voltage drops 40 as is the current practice. The whole chip timing data file 40 along with the results from the calculation of incremental I/O path delay 31 is used as input to generate a modified whole chip timing data file with voltage drop effects 41. The incremental I/O path delay 31 is connected to the step to generate the whole chip timing data file 41 by means of a flow chart connector "B". From the whole chip timing data file with voltage drop effects 41 traditional timing tools are used to perform a whole chip cell level timing verification 42. As a result whole chip cell level timing verification with the inclusion of voltage drop effects on delay is performed with similar elapsed time as experience with traditional timing verification without considerations to voltage drop effects.

While the invention has been particularly shown and described with reference to preferred embodiments thereof, it will be understood by those skilled in the art that various changes in form and details may be made without departing from the spirit and scope of the invention.

What is claimed is:

1. A method for chip design with cell level timing verification, comprising:

a) characterizing cell timing variation rates, b) calculating incremental cell I/O (input/output) path delay, c) performing whole chip cell level timing verification.

2. The method of claim 1, wherein preparing for and performing said whole chip cell level timing verification is done using Spice-related design tools.

3. The method of claim 1, wherein characterizing cell timing variation rates further comprises:

a) preparing a cell net list, b) defining I/O delay paths, c) constructing simulation data for characterizing timing variation rate with respect to supply voltage change, d) performing simulation, e) calculating said timing variation rate.

4. The method of claim 1, wherein calculating incremental cell I/O path delay further comprises:

a) calculating delay change using value of voltage change and said timing variation rate, b) calculating incremental I/O path delay by including delay changes caused by all power pins.

5. The method of claim 1, wherein performing whole chip cell level timing verification further comprises:

a) generating a whole chip timing data file without voltage drop effect, b) generating a modified whole chip timing data file with voltage drop effect, c) performing whole chip cell level timing verification.

6. The method of claim 5, wherein generating said modified whole chip modifies said whole chip timing data file without voltage drop effect with said incremental I/O path delay.

7. A chip design cell timing verification means, comprising:

a means for creating a net list, a means for defining cell I/O delay paths, a means for performing simulation and calculating timing variation rates, a means for calculating incremental cell I/O path delay, a means for performing a whole chip cell level timing verification.

8. The chip design cell timing verification means of claim 7, wherein the means for defining cell I/O delay paths further comprises calculating means for characterizing timing variations as a result of supply voltage changes.

9. The chip design cell timing verification means of claim 7, wherein the means for performing said whole chip cell level timing verification modifies a whole chip timing data file without voltage drop effects with said incremental cell I/O path delay.

10. The chip design cell timing verification means of claim 7, wherein said means for calculating incremental cell I/O path delay includes a means for determining delay variations caused by each power pin.

* * * * *